US009337104B1

(12) United States Patent
Ni et al.

(10) Patent No.: US 9,337,104 B1

(45) Date of Patent: May 10, 2016

(54) METHOD FOR CHEMICAL MECHANICAL POLISHING OF HIGH-K METAL GATE STRUCTURES

(71) Applicant: Semiconductor Manufacturing International (Shanghai) Corporation, Shanghai (CN)

(72) Inventors: Jinghua Ni, Shanghai (CN); Jian Zhao, Shanghai (CN); Lei Wu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/709,465

(22) Filed: May 11, 2015

(51) Int. Cl.

| | |
|---|---|
| ***H01L 21/8234*** | (2006.01) |
| ***H01L 21/28*** | (2006.01) |
| ***H01L 27/088*** | (2006.01) |

(52) U.S. Cl.

CPC .... *H01L 21/82345* (2013.01); *H01L 21/28008* (2013.01); *H01L 27/088* (2013.01)

(58) Field of Classification Search

CPC ........................ H01L 21/28008; H01L 27/088

See application file for complete search history.

(56) References Cited

U.S. PATENT DOCUMENTS

2010/0164008 A1* 7/2010 Mehrad ........... H01L 21/823842 257/369

* cited by examiner

*Primary Examiner* — Caleb Henry

*Assistant Examiner* — Mounir Amer

(74) *Attorney, Agent, or Firm* — Kilpatrick Townsend & Stockton LLP

(57) ABSTRACT

A method for manufacturing a semiconductor device includes providing a substrate, a dielectric layer on the substrate, a first hard mask layer on the substrate, and a second hard mask layer on the first hard mask layer. The method also includes removing the first hard mask layer using a reactive gas that does not cause damage to the dielectric layer to improve the performance and yield of the semiconductor device.

17 Claims, 5 Drawing Sheets

METHOD FOR CHEMICAL MECHANICAL POLISHING OF HIGH-K METAL GATE STRUCTURES

CROSS-REFERENCES TO RELATED APPLICATIONS

This application claims priority to Chinese patent application No. 2014101226194.7, filed on May 26, 2014, the content of which is incorporated herein by reference in its entirety.

BACKGROUND OF THE INVENTION

The present invention relates to semiconductor devices and the fabrication of semiconductor devices, and more particularly to semiconductor devices in 32 nm technology nodes and beyond.

In the field of semiconductor technology, aluminum or aluminum alloy is mainly used in high-k metal gate (HKMG) process technology nodes at 32 nm and below (e.g., 28 nm). The use of aluminum or aluminum alloy for metal gate electrodes has cost and performance advantages. The aluminum gate chemical mechanical polishing (CMP) process is a very important process for manufacturing high-k metal gate transistors having aluminum gates.

In order to increase the gap filling space, a CMP process of aluminum gates typically includes two steps: a CMP process for N-type aluminum gate transistors and a CMP process for P-type aluminum gate transistors.

Since a conventional CMP process utilizes a polish slurry that has a polysilicon removal rate greater than the aluminum removal rate, polysilicon gates tend to be over-polished. Furthermore, an over-polishing of polysilicon gates may occur during the CMP process of the aluminum gates of the N-type transistors.

FIG. 1A is a simplified cross-sectional view illustrating process steps of forming a semiconductor structure. FIG. 1A includes a top part, a middle part, and a bottom part. As shown in FIG. 1A, the top part shows three transistor regions 101A, 101B, and 101C that are separated by an interlayer dielectric layer 101D. Transistor region 101A is denoted a P-type aluminum gate transistor region; transistor region 101B is denoted an N-type aluminum gate transistor region; and transistor region 101C is denoted a polysilicon gate transistor region. The middle part shows that there is a height loss 121 in the N-type aluminum gate transistor region and in the polysilicon gate transistor gate region after a chemical mechanical polishing (CMP) process the P-type aluminum gate transistor region has been performed. The bottom part shows that there is a further height loss 122 after a chemical mechanical polishing process of the N-type aluminum gate region has been performed. As can be clearly seen, the height of the polysilicon gate transistor region is significantly reduced due to over-polishing, which seriously affects the performance and yield of the manufactured semiconductor device.

Furthermore, in the above process of manufacturing a semiconductor device, in the etching process of the hard mask 204 (typically made of titanium nitride) to expose a surface of the P-type aluminum gate transistor region, over-etching is often required to completely remove the portion of the hard mask located on the corresponding surface of the P-type aluminum gate transistor region. However, the over-etching of the hard mask layer may unduly etch the interlayer dielectric layer (typically an oxide) 202, which is located below the portion of the hard mask 204 to be removed, leading to a loss of the thickness 2021 of the interlayer dielectric layer 202, as shown in FIG. 1B. The loss of thickness in the interlayer dielectric layer 202 results in a need to increase the amount of polishing that causes a decrease in the height of the P-type aluminum gate transistor region, which, in turn, causes the height of the N-type aluminum gate transistor region to be further reduced (height loss 121 in FIG. 1A). This can adversely affect the performance and yield of the semiconductor device. Similarly, in the process of removing the hard mask on the N-type aluminum gate transistor region by etching, the loss of thickness in the interlayer dielectric layer causes a decrease in the height of the N-type aluminum gate transistor region, which in turn further reduces the height of the polysilicon gate transistor region (height loss 122 in FIG. 1A).

Thus, in the process of removing the hard mask to expose the P-type (or N-type) aluminum gate transistor region, an over-etching is typically performed to completely remove the portion of the hard mask disposed on the corresponding surface of the P-type (or N-type) aluminum gate transistor region. The over-etching causes undue etching of the interlayer dielectric layer, which is located below the portion of the hard mask to be removed, leading to a loss of the thickness of the interlayer dielectric layer. The thickness loss of the interlayer dielectric layer, in turn, causes a loss of thickness of the polysilicon gate of the polysilicon gate transistor region, which negatively impacts the performance and yield of the semiconductor device.

In view of the foregoing, there is a need for a novel method and apparatus for manufacturing a semiconductor device that can overcome the deficiencies of the prior art.

BRIEF SUMMARY OF THE INVENTION

Embodiments of the present invention provide a method for manufacturing a semiconductor device structure and a semiconductor device that can easily remove a hard mask layer without impacting the performance and yield of the semiconductor device.

In accordance with the present invention, a method for manufacturing a semiconductor device includes providing a substrate, a dielectric layer on the substrate, a first hard mask layer on the substrate, and a second hard mask layer on the first hard mask layer. The method also includes removing the first hard mask layer using a reactive gas that is not susceptible to cause damage to the dielectric layer to improve the performance and yield of the semiconductor device.

In an embodiment, a method for manufacturing a semiconductor device includes providing a semiconductor substrate containing a front-end device, the front-end device comprises a first type metal gate transistor region including a first dummy gate, a second type metal gate transistor region including a second dummy gate, and a polysilicon gate transistor region including a polysilicon gate. The method also includes forming an interlayer dielectric layer on the semiconductor substrate (S101), forming a first hard mask layer on the interlayer dielectric layer, and forming a second hard mask layer on the first hard mask layer (S102). The method further includes forming a mask layer on the second hard mask layer, the mask layer has an opening exposing a portion of the second hard mask layer disposed above the first type metal gate transistor (S103). The method also includes removing the exposed portion of the second hard mask layer to expose a portion of the first hard mask layer, and removing the exposed portion of the first hard mask layer using a reactive gas that does not cause damage to the interlayer dielectric layer (S104). In addition, the method includes removing the first dummy gate (to form a trench), forming a first work function metal layer in the location of the removed first dummy gate (i.e., in the trench), and forming a metal gate layer on the first work function metal layer (S105). The method further includes removing a portion of the first work function metal layer and a portion of the metal gate layer that are over the interlayer dielectric layer, the first hard mask layer, and the second hard mask layer to form a metal gate (S106).

In an embodiment, the first hard mask layer comprises an amorphous carbon material or a silicon-based antireflective layer. The second hard mask layer comprises titanium nitrite.

In an embodiment, the first hard mask layer is formed by chemical vapor deposition. The second hard mask layer is formed by chemical vapor deposition.

In an embodiment, the reactive gas comprises a gas mixture of hydrogen and nitrogen.

In an embodiment, removing the exposed portion of the first hard mask layer is performed in a reaction chamber under a pressure in a range between 500 mT and 2000 mT, a power in a range between 1000 W and 5000 W, and a gas flow rate in a range between 500 sccm and 5000 sccm.

In an embodiment, the first dummy gate, the second dummy gate, and the polysilicon gate may be concurrently formed in a same process and have the same height.

In an embodiment, forming the interlayer dielectric layer (S101) may include forming a dielectric material on the semiconductor substrate, and removing a portion of the semiconductor substrate that exceeds a height of the first dummy gate, a height of the second dummy gate, or a height of the polysilicon gate.

In an embodiment, forming the mask layer may include forming a photoresist layer on the second hard mask layer, exposing the photoresist layer to light, and developing the exposed photoresist layer to form a patterned mask layer.

In an embodiment, the metal gate layer comprises aluminum or aluminum alloy.

In an embodiment, removing the portion of the metal gate layer, the portion of the first work function metal layer that are over the interlayer dielectric layer, the second hard mask layer, and the first hard mask layer comprises a chemical mechanical polishing process. The chemical mechanical polishing process may stop when a surface of the polysilicon gate is exposed.

In an embodiment, the method may further include removing the second dummy gate in the second type metal gate transistor region to form a second trench, forming a second work function metal layer in the second trench, and forming a second metal gate layer on the second work function metal layer.

In an embodiment, the first type is a P-type and the second type is an N-type, or the first type is an N-type and the second type is a P-type.

Embodiments of the present invention also provide a semiconductor device comprising a semiconductor substrate and a front-side device in the semiconductor substrate. The front-side device includes a first type metal gate transistor region including a first metal gate, a second type metal gate transistor region including a second metal gate, and a polysilicon gate transistor region including a polysilicon gate. The first metal gate, the second metal gate and the polysilicon gate have a same height and fabricated with the above-described method.

The following description, together with the accompanying drawings, will provide a better understanding of the nature and advantages of the claimed invention.

DETAILED DESCRIPTION OF THE INVENTION

Figure 1A:
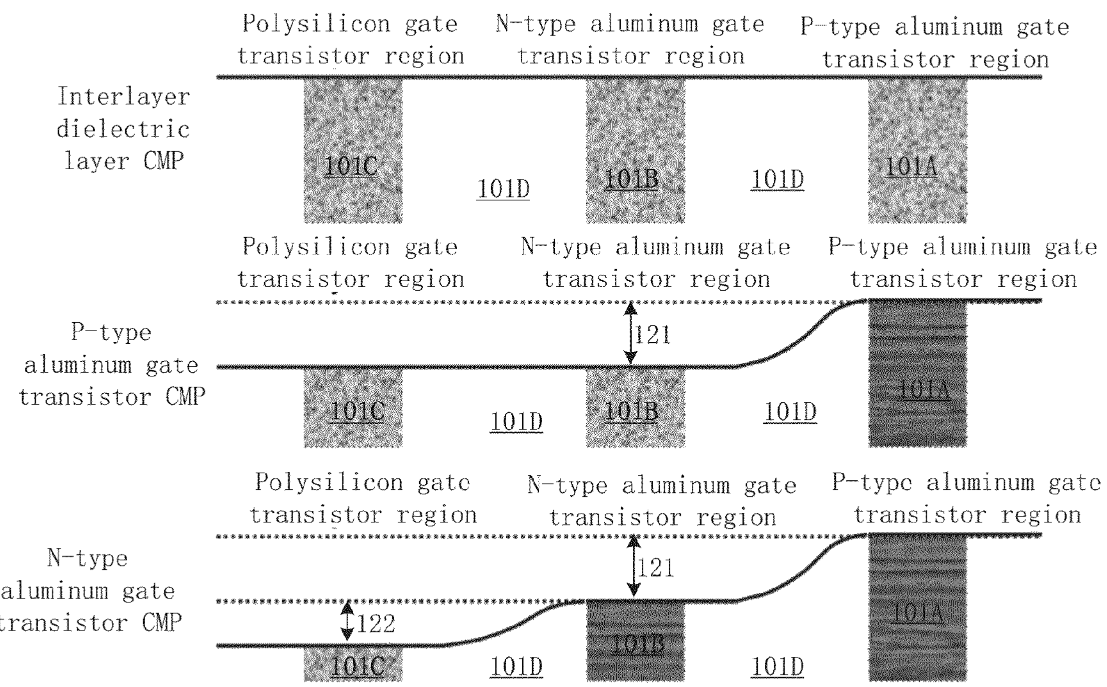
FIG. 1A is a simplified cross-sectional view illustrating process steps of forming a semiconductor structure in the prior art.
Figure 1B:
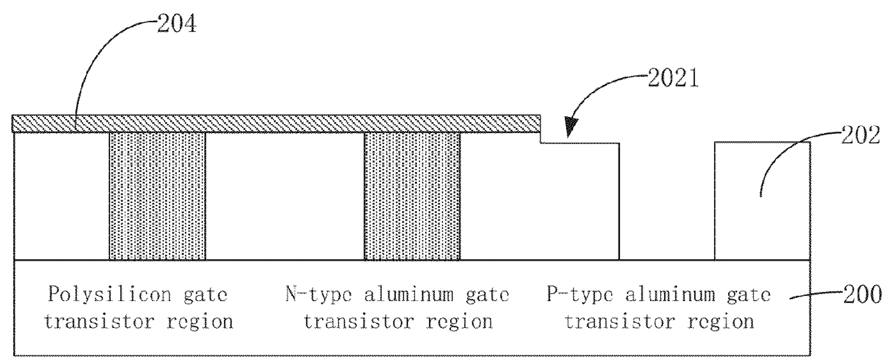
FIG. 1B is a simplified cross-sectional view illustrating a semiconductor structure after removing a hard mask by etching to expose a surface of a P-type aluminum gate transistor regions in the prior art.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "substrate" and "wafer" may be used alternatively and may include silicon-on-insulator (SOI) or silicon-on-sapphire (SOS) technology, doped and undoped semiconductors, epitaxial layers of silicon supported by a base semiconductor foundation, and other semiconductor structures.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The term "vertical" as used in this application is defined as a plane perpendicular to the conventional plane or surface of a wafer or substrate, regardless of the orientation of the wafer or substrate. The term "horizontal" refers to a direction perpendicular to the vertical as defined above.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Prepositions, such as "on", "side" (as in "sidewall"), "below", "above", "higher", "lower", "over" and "under" are defined with respect to the conventional plane or surface being on the top surface of the wafer or substrate, regardless of the orientation of the wafer or substrate. It will be understood that these terms are intended to encompass different orientations of the device in addition to the orientation depicted in the figures.

Embodiment 1

Figure 2A:
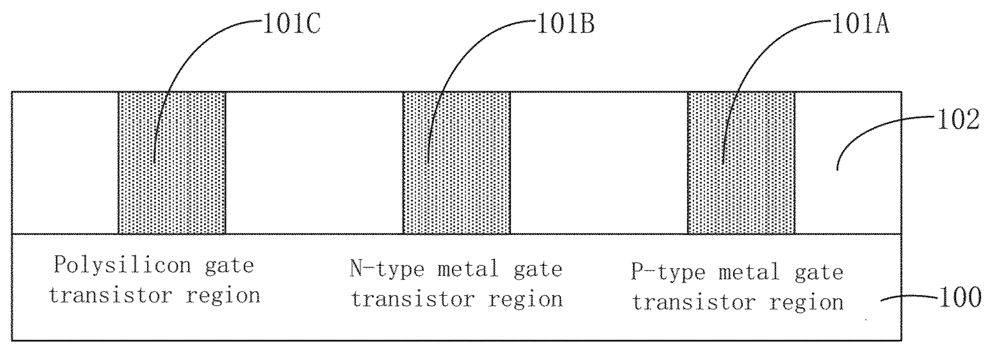
FIGS. 2A to 2F are cross-sectional views depicting stages of a method of manufacturing a semiconductor device according to an embodiment of the present invention.
Figure 2B:
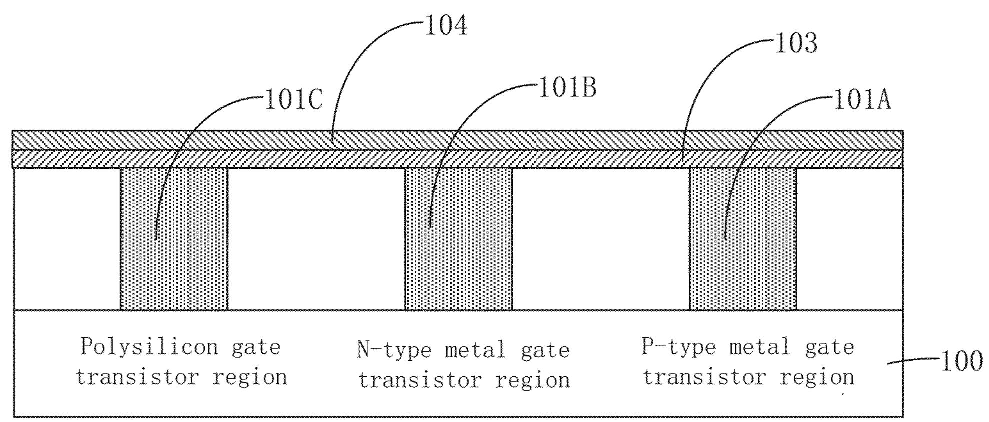
Figure 2C:
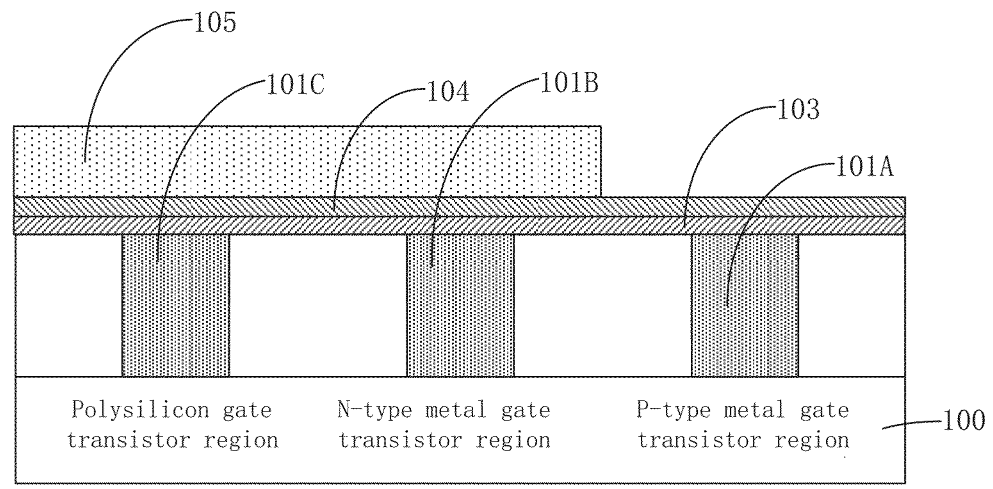
Figure 2D:
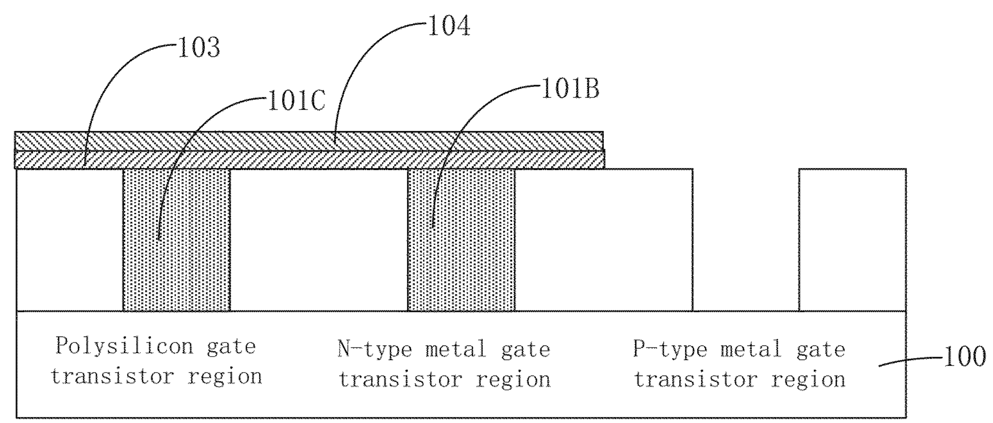
Figure 2E:
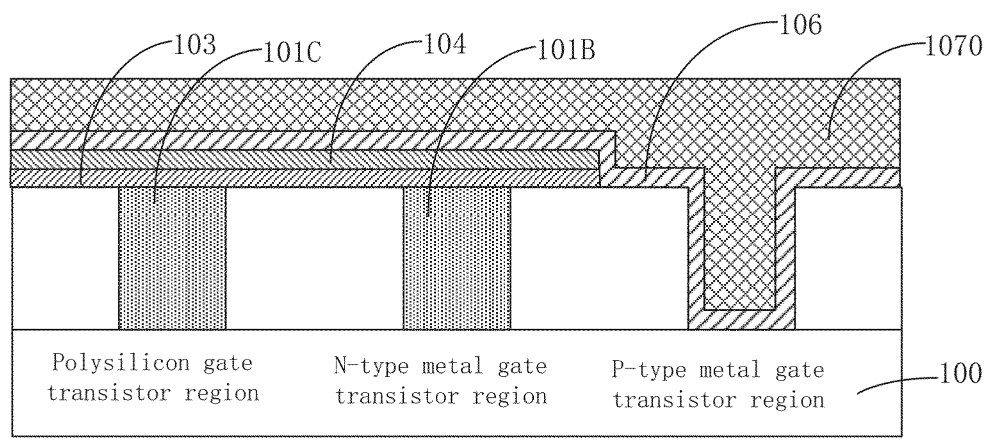
Figure 2F:
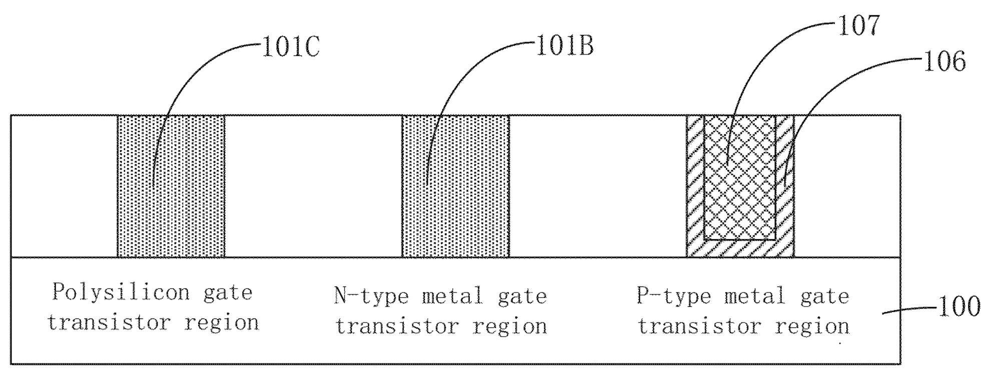
Figure 3:
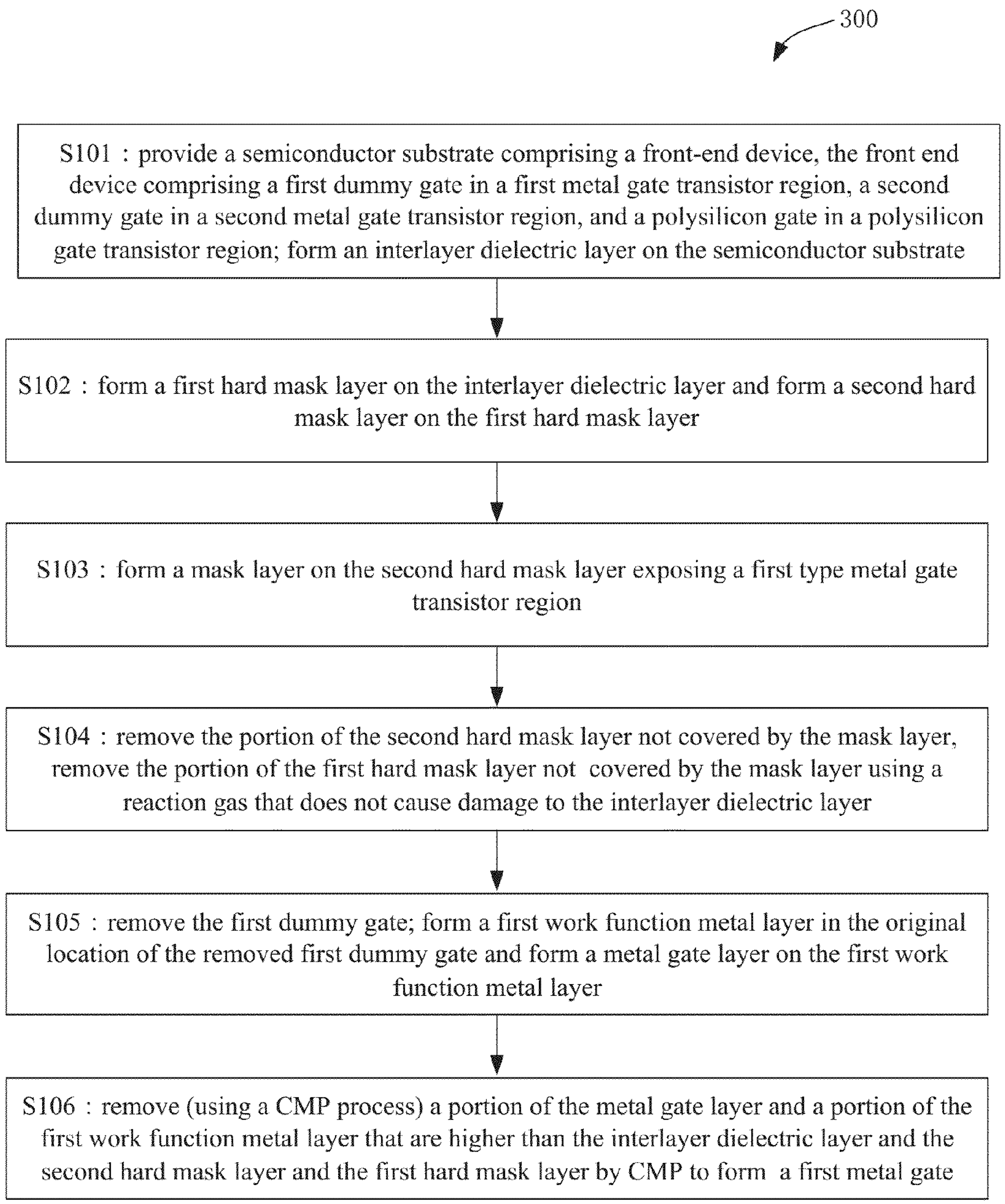
FIG. 3 is a simplified flow chart of a method of manufacturing a semiconductor device according to an embodiment of the present invention.

FIGS. 2A to 2F are cross-sectional views depicting stages of a method of manufacturing a semiconductor device according to an embodiment of the present invention, and FIG. 3 is a simplified flow chart of a method of manufacturing a semiconductor device according to an embodiment of the present invention. With reference to FIGS. 2A-2F and FIG. 3, a method according to the embodiment includes the following steps:

Step A1: provide a semiconductor substrate 100 comprising a front-end device, the front-end device comprises a P-type metal gate transistor region having a first dummy gate 101A, an N-type metal gate transistor region having a second dummy gate 101B, and a polysilicon gate region having a polysilicon gate 101C; form an interlayer dielectric layer on the semiconductor substrate, as shown in FIG. 2A.

In the embodiment, the front-end device is referred to as a structure that has been formed on the semiconductor substrate and may contain certain components, but the structure has not been completely processed to be a final semiconductor device. Of course, the front-end device is shown in FIG. 2A by way of example only, not by way of limitation. In other words, the front-end device may contain other components.

The P-type metal gate transistor region is referred to a region that is used to form one or more P-type metal gate transistors. The N-type metal gate transistor region is referred to a region that is used to form one or more N-type metal gate transistors. The polysilicon gate transistor region is referred to a region that is used to form one or more polysilicon gate transistors.

It is to be understood that polysilicon gate transistors are normal transistors to distinguish from high-k metal gate transistors. Polysilicon gate transistors can be N-type transistors or P-type transistors.

In the present disclosure, semiconductor substrate 100 may be a monocrystalline silicon substrate, SOI substrate, and other suitable substrate. First and second dummy gates 101A, 101B may be made of a same material as that of polysilicon gate 101C, i.e., a polysilicon material. In one exemplary embodiment, first and second dummy gates 101A, 101B may have the same height as polysilicon gate 101C, and can be formed together with polysilicon gate 101C using a same manufacturing process. It is understood that the number of first, second dummy gates and the number of polysilicon gates in the embodiment can be any number N. In the example shown in FIG. 2A, only one first dummy gate 101A, one second dummy gate 101B, and one polysilicon gate 101C are used for the respective P-type, N-type and polysilicon gate transistor region, i.e., N=1, but it is understood that the number (N=1) is arbitrary chosen for describing the example embodiment and should not be limiting.

In the embodiment, interlayer dielectric layer 102 is formed on semiconductor substrate 100 and filling the air gaps or voids disposed between first dummy gate 101A, second dummy gate 101B, and polysilicon gate 101C.

In an embodiment, forming interlayer dielectric layer 102 may include depositing a dielectric material on semiconductor substrate 100, and removing the excess dielectric material that is higher than the top surface of first dummy gate 101A, second dummy gate 101B, and polysilicon gate 101C using a CMP process, so that the top surface of the dielectric layer is flush (coplanar) with the surface of the first dummy gate 101A, second dummy gate 101B, and polysilicon gate 101C.

Step A2: form a first hard mask layer 103 on interlayer dielectric layer 102, and form a second hard mask layer 104 on first hard mask layer 103, as shown in FIG. 2B.

First hard mask layer 103 covers the top surface of first dummy gate 101A, second dummy gate 101B, and polysilicon gate 101C. Second hard mask layer 104 covers the top surface of first hard mask layer 103.

First hard mask layer 103 may include an advanced patterning film such as an amorphous carbon layer, an anti-reflective coating layer such as Si-BARC, or other suitable materials. Second hard mask layer 104 formed on first mask layer may include titanium nitride or other suitable materials.

First hard mask layer 103 may be formed using a chemical vapor deposition, or other suitable processes. Second hard mask layer 104 on first mask layer may be formed using a chemical vapor deposition process, or other suitable processes.

The embodiment depicted in FIG. 2B is advantageous over prior art methods in that it provides first and second hard mask layers. In contrast, prior art methods consist of forming a single hard mask layer structure. Therefore, when a subsequent etching is performing on the single hard mask layer structure to expose a surface of the P-type aluminum gate transistor region, because over-etching is required to completely remove the portion of the single hard mask layer structure corresponding to the exposed surface of the P-type aluminum gate transistor region, the exposed surface is often improperly etched to eventually result in a height reduction of the polysilicon gate of the polysilicon gate transistor region, thereby negatively impacting the performance and yield of the semiconductor device.

In accordance with the present invention, first mask layer 103 is added to second mask layer 104. When a subsequent etching process is performing on the second hard mask layer to expose the surface of the P-type (or N-type) aluminum gate transistor region, the over-etching removes a portion of the second hard mask layer corresponding to the surface of the P-type (or N-type) aluminum gate transistor region to be exposed. Because of the presence of the first hard mask layer below the second hard mask layer, the interlayer dielectric layer will not be unduly affected. Thereafter, the portion of the first hard mask layer corresponding to the surface of the P-type (or N-type) aluminum gate transistor region to be exposed is then removed using a reactive gas that does not impact the interlayer dielectric layer. Because the interlayer dielectric layer is not affected in the removal process of the first mask layer, it is possible to maintain the final height of the polysilicon gate of the polysilicon gate transistor region, thereby improving the performance and yield of the semiconductor device.

Step A3: form a mask layer 105 on the second hard mask layer 104 having an opening for exposing the P-type aluminum gate transistor region, as shown in FIG. 2C. That is, the mask layer 105 covers all other regions of semiconductor substrate 100 except the P-type aluminum gate transistor region.

In an embodiment, forming the mask layer 105 may include forming a photoresist layer on the second hard mask layer 104, exposing the photoresist layer to light (radiation) and developing the radiated photoresist layer to form a patterned mask layer having an opening at the location of the metal gate transistor region.

Step A4: etch the second hard mask layer 104 using the patterned mask layer 105 as a mask to remove the portion not covered by the mask layer 105 (i.e., the portion above the P-type metal gate transistor layer), and removing the portion of the first mask layer 103 not covered by the mask layer 105 and the second mask layer 104 using a gas mixture comprising hydrogen ($H_2$) and nitrogen ($N_2$), as shown in FIG. 2D. Thereafter, the first dummy gate 101A in the P-type metal transistor region is removed, as shown in FIG. 2D.

The interlayer dielectric layer 102 disposed at opposite sides of the metal gate transistor region does not suffer undue etching, as shown in FIG. 2D.

In the embodiment, the removal of the portion of the first hard mask layer 103 not covered by the mask layer 105 may be performed in a reaction chamber using the gas mixture comprising hydrogen and nitrogen, the conditions can be set with the follow process parameters: a pressure in the range between 500 mT and 2000 mT, a power in the range between 1000 W and 5000 W, a gas flow rate in the range between 500 sccm and 5000 sccm. The volume ratio of hydrogen and nitrogen can be chosen according to actual requirements. In a specific embodiment, the volume ratio of hydrogen to nitrogen can be $H_2$:$N_2$=2:1. In addition, the gas mixture of hydrogen and nitrogen may include other suitable gases. In this step, any gas mixture may be used to remove the portion of the first hard mask layer 103 that is not covered by the mask layer 105 as long as the gas mixture does not cause damage to the interlayer dielectric layer.

Over-etching can be used to completely remove the portion of the second hard mask layer 104 that is disposed over the P-type metal gate transistor region, the over-etching does not cause undue damage to the interlayer dielectric layer 102 because the first hard mask layer 103 is disposed below the second hard mask layer 104. The removal of the portion of the first hard mask layer 103 located above the P-type metal gate transistor region is using a reactive gas that does not cause undue etching of the first dielectric layer 102, i.e., the reactive gas has a high etching selection ratio of the first hard mask layer with respect to the interlayer dielectric layer, thus does not cause undue etching of the portion of the interlayer dielectric layer disposed in the corresponding P-type metal gate transistor region. In other words, in accordance with the present invention, due to the additional first hard mask layer 103 and the use of a reactive gas that does not cause undue etching of the interlayer dielectric layer when removing the exposed portion of the first hard mask layer. This measure ensures that the height of the interlayer dielectric layer can be maintained, thereby improving the performance and yield of the semiconductor device.

The removal of the first dummy gate 101A can utilize dry etching or wet etching. In an embodiment, wet etching can utilize tetramethyl ammonium hydroxide (TMAH) as etchant, which ensures that the interlayer dielectric layer is not unduly etched when removing the polysilicon dummy gate 101A.

Step A5: form a first work function metal layer 106 in the location of the first dummy gate 101A that has been removed, and form a metal gate layer 1070 on the first work function metal layer 106, as shown in FIG. 2E.

The first work function metal layer 106 may be aluminum or other suitable materials. The metal gate layer 1070 may be aluminum, aluminum alloy or other suitable materials.

The first work function metal layer 106 may be formed by a deposition process or other suitable processes. The metal gate layer 1070 may be formed by a deposition process or other suitable processes.

Step A6: remove a portion of metal gate layer 1070 and a portion of first work function metal layer 106 that are above the top surface of the interlayer dielectric layer by performing a CMP process to form a first metal gate 107, as shown in FIG. 2F.

In an embodiment, the CMP process can be controlled in such a way that the CMP process will stop when the top surface of the polysilicon gate 101C is exposed in order to avoid excessive polishing of the polysilicon gate 101C.

After step A6, the following steps can be performed with reference to steps A2 to A6:

Remove the second dummy gate 101B in the N-type metal gate transistor region; form a second work function metal layer in the location of the second dummy gate 101B that has been removed; form a metal gate electrode on the second work function metal layer.

In the embodiment, a metal gate may be formed first in the N-type metal gate transistor region, followed by the formation of a metal gate in the P-type metal gate transistor region. The order of forming the metal gate in the P-type or N-type metal gate transistor region may be arbitrarily determined. That is, the P-type metal gate transistor may be referred to as the first type metal gate transistor while the N-type metal gate transistor may be referred to as the second type metal gate transistor. Alternatively, the N-type metal gate transistor may be referred to as the first type metal gate transistor while the P-type metal gate transistor may be referred to as the second type metal gate transistor.

In the embodiment of the present invention, through the addition of first mask layer 103 disposed between interlayer dielectric layer 102 and second hard mask layer 104, and through the use of a reactive gas that does not cause undue etching of the interlayer dielectric layer to remove the portion of the first hard mask layer not covered by the mask layer 105, the dummy gate 101A can be removed without causing undue etching to the corresponding region of the interlayer dielectric layer. Therefore, the polysilicon gate in the polysilicon gate transistor region will not be excessively removed so that the height of the polysilicon gate can be maintained to some extent, thereby increasing the performance and yield of the semiconductor device.

Embodiment 2

FIG. 3 is a simplified flow chart of a method 300 for manufacturing a semiconductor device according to an embodiment of the present invention. Method 300 includes:

S101: provide a semiconductor substrate comprising a front-end device, the front-end device comprises a first type metal gate transistor region, a second type metal gate transistor region, and a polysilicon gate transistor region, the first type metal gate transistor region comprises a first dummy gate, the second type metal gate transistor region comprises a second dummy gate, the polysilicon gate transistor region comprises a polysilicon gate; form an interlayer dielectric layer on the semiconductor substrate;

S102: form a first hard mask layer on the interlayer dielectric layer; form a second hard mask layer on the first hard mask layer;

S103: form a mask layer on the second hard mask layer, the mask layer having an opening for exposing a portion of the second hard mask layer located above the first type metal gate transistor region;

S104: remove the exposed portion of the second hard mask layer; remove the portion of the first hard mask layer not covered by the second hard mask layer using a reactive gas that does not cause damage to the interlayer dielectric layer;

S105: remove the first dummy gate (to form a trench having a bottom and vertical walls); form a first work function metal layer in the location where the first dummy gate has been removed (i.e., on the bottom and the surface of the vertical walls of the trench); form a metal gate layer on the first work function metal layer (filling the trench);

S106: remove the portion of the metal gate layer and the portion of the first work function metal layer that are higher than the surface of the interlayer dielectric layer, remove the second hard mask layer, and the first hard mask layer by performing a CMP process to form a first metal gate.

In an embodiment, an electronic device may include a semiconductor device manufactured using the above-described method. The electronic device may be a laptop, a netbook, a game console, a TV, a DVD player, a GPS device, a camera, a voice recorder, MP3, MP4, PSP, a mobile phone, and other semiconductor devices including intermediate products and electronic components that are manufactured using the above-described method to improve performance.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. For example, although three gate transistor regions (P-type, N-type, polysilicon gate transistor regions) are used, it is understood that the number of the transistor regions can be more or fewer than three in other embodiments. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method for manufacturing a semiconductor device, the method comprising:

providing a semiconductor substrate containing a front-end device, the front-end device comprising a first type metal gate transistor region including a first dummy gate, a second type metal gate transistor region including a second dummy gate, and a polysilicon gate transistor region including a polysilicon gate;

forming an interlayer dielectric layer on the semiconductor substrate;

forming a first hard mask layer on the interlayer dielectric layer;

forming a second hard mask layer on the first hard mask layer;

forming a mask layer having an opening on the second hard mask layer exposing a portion of the second hard mask layer disposed above the first type metal gate transistor;

removing the exposed portion of the second hard mask layer to expose a portion of the first hard mask layer;

removing the exposed portion of the first hard mask layer using a reactive gas that is not susceptible to cause damage to the interlayer dielectric layer;

removing the first dummy gate;

forming a first work function metal layer in a location where the first dummy gate has been removed;

forming a metal gate layer on the first work function metal layer;

removing a portion of the first work function metal layer and a portion of the metal gate layer that are over the interlayer dielectric layer, the second hard mask layer, and the first hard mask layer to form a metal gate.

2. The method of claim 1, wherein the first hard mask layer comprises an amorphous carbon material or a silicon-based antireflective coating material.

3. The method of claim 1, wherein the second hard mask layer comprises titanium nitrite.

4. The method of claim 1, wherein the first hard mask layer is formed by chemical vapor deposition.

5. The method of claim 1, wherein the second hard mask layer is formed by chemical vapor deposition.

6. The method of claim 1, wherein the reactive gas comprises a gas mixture of hydrogen and nitrogen.

7. The method of claim 1, wherein removing the exposed portion of the first hard mask layer is performed in a reaction chamber under a pressure in a range between 500 mT and 2000 mT, a power in a range between 1000 W and 5000 W, and a gas flow rate in a range between 500 sccm and 5000 sccm.

8. The method of claim 1, wherein the first dummy gate, the second dummy gate, and the polysilicon gate are concurrently formed in a same process.

9. The method of claim 1, wherein the first dummy gate, the second dummy gate, and the polysilicon gate have a same height.

10. The method of claim 1, wherein forming the interlayer dielectric layer comprises:

forming a dielectric material on the semiconductor substrate;

removing a portion of the dielectric material that exceeds a height of the first dummy gate, a height of the second dummy gate, or the height of the polysilicon gate.

11. The method of claim 1, wherein forming the mask layer comprises:

forming a photoresist layer on the second hard mask layer;

exposing the photoresist layer to light; and developing the exposed photoresist layer to form a patterned mask layer.

12. The method of claim 1, wherein the metal gate layer comprises aluminum or aluminum alloy.

13. The method of claim 1, wherein removing the second hard mask layer, the first hard mask layer, the metal gate layer and the first work function metal layer comprises a chemical mechanical polishing process.

14. The method of claim 13, wherein the chemical mechanical polishing process stops when a surface of the polysilicon gate is exposed.

15. The method of claim 1, further comprising:

removing the second dummy gate in the second type metal gate transistor region;

forming a second work function metal layer in a location where the second dummy gate has been removed;

forming a second metal gate layer on the second work function metal layer.

16. The method of claim 1, wherein the first type is a P-type and the second type is an N-type, or the first type is an N-type and the second type is a P-type.

17. The method of claim 1, wherein removing the portion of the first work function metal layer and the portion of the metal gate layer that are over the interlayer dielectric layer, the second hard mask layer, and the first hard mask layer comprises performing a CMP process.

* * * * *